United States Patent [19]

Shin et al.

[11] Patent Number: 5,563,079
[45] Date of Patent: Oct. 8, 1996

[54] METHOD OF MAKING A FIELD EFFECT TRANSISTOR

[75] Inventors: Jin H. Shin; Young S. Kwon, both of Seoul; Chang T. Kim, Kyungsangbuk-do, all of Rep. of Korea

[73] Assignee: Goldstar Co., Ltd., Seoul, Rep. of Korea

[21] Appl. No.: 73,428

[22] Filed: Jun. 9, 1993

[30] Foreign Application Priority Data

Jun. 9, 1992 [KR] Rep. of Korea ............... 9915/1992

[51] Int. Cl.⁶ ............................................. H01L 21/338
[52] U.S. Cl. .......................... 437/40; 437/228; 437/912; 437/978
[58] Field of Search ........................... 437/912, 40, 41, 437/44, 944, 228 S, 40 SH, 40 RG; 257/267, 283, 330, 332

[56] References Cited

U.S. PATENT DOCUMENTS

| | | | |
|---|---|---|---|
| 4,910,157 | 3/1990 | Hasegawa et al. | 437/22 |
| 4,929,567 | 5/1990 | Park et al. | 437/41 |
| 4,959,326 | 9/1990 | Roman et al. | 437/40 |
| 4,996,167 | 2/1991 | Chen | 437/40 |
| 4,997,778 | 3/1991 | Sim et al. | 437/40 |
| 5,182,218 | 1/1993 | Fujihira | 437/22 |

FOREIGN PATENT DOCUMENTS

| | | | |
|---|---|---|---|
| 57-183037 | 11/1982 | Japan | 437/944 |
| 60-234375 | 11/1985 | Japan | 437/912 |
| 63-131523 | 6/1988 | Japan | 437/192 |
| 3-23643 | 1/1991 | Japan | 437/912 |
| 3-165526 | 7/1991 | Japan | 437/912 |

OTHER PUBLICATIONS

Wolf et al., Silicon Processing, vol. 1, Lattice Press, 1986, pp. 194, 407–455, 532–547.

*Primary Examiner*—T. N. Quach
*Attorney, Agent, or Firm*—Finnegan, Henderson, Farabow, Garrett & Dunner, L.L.P.

[57] ABSTRACT

A method of making a FET includes the steps of forming a source and a drain at respective edges of the surface of a semiconductor substrate, forming a first insulation film on the whole surfaces of the semiconductor substrate, the source, and the drain, coating a photoresist on the first insulation film, patterning the photoresist using a photolithography process to form a photoresist pattern having a first space corresponding to a gate length between the source and the drain, forming a second insulating film on the whole surfaces of the exposed first insulation film and the photoresist pattern, etching the second insulation film to form sidewall insulation films at the sidewalls of the photoresist patterns, etching the first insulation film using the sidewall insulation films and the photoresist pattern as an etching mask to form first insulation film patterns, which form a second space having a width smaller than that of the first space, beneath the first space, removing the sidewall insulation films to form a T-shaped space, and depositing a conductor to form a T-shaped gate in the T-shaped space.

12 Claims, 14 Drawing Sheets

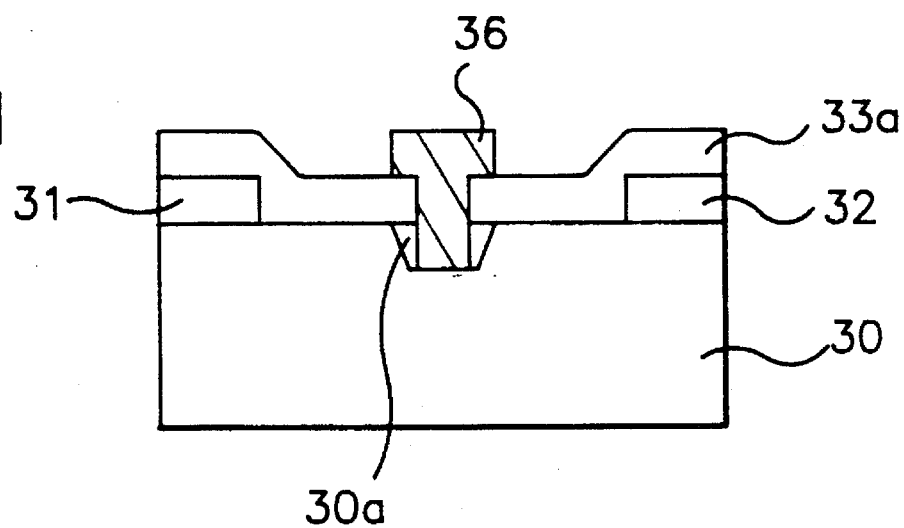
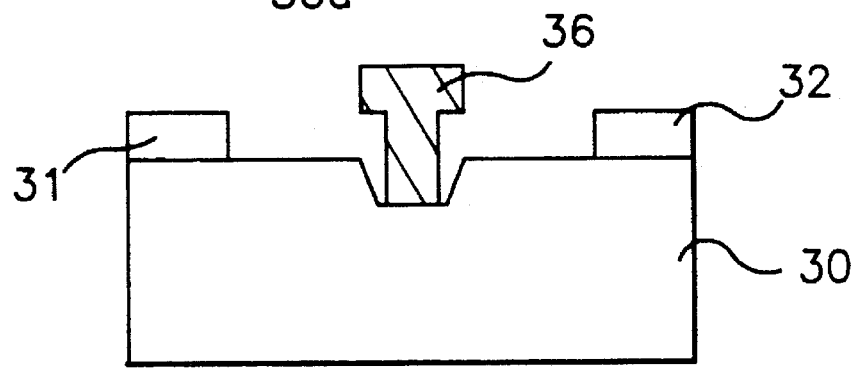
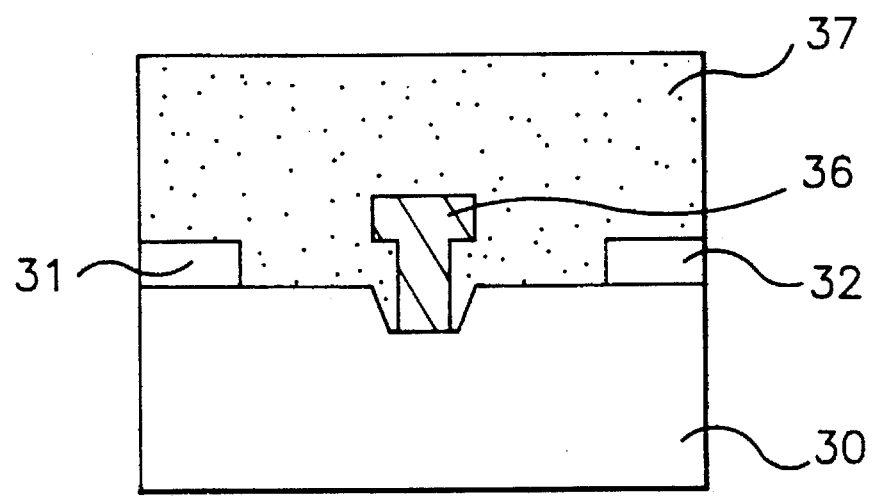

METHOD OF MAKING A FIELD EFFECT TRANSISTOR

BACKGROUND OF THE INVENTION

The present invention relates to a method of making a field effect transistor, and more particularly, to a method of making a field effect transistor for high frequency.

It is generally advantageous for a field effect transistor (hereinafter, FET) for high frequency (GHZ band) to comprise a gate having a submicron length to reduce noises.

Referring to FIG. 1, a conventional metal semiconductor field effect transistor (MSFET) is illustrated having a T-shaped gate(or a mushroom-shaped gate).

High speed FETs for low noises such as a GaAs FET and a high electron mobility transistor have the structure shown in FIG. 1, to lower a resistance value of the gate and to reduce a length of the gate.

In FIG. 1, reference numeral 1 denotes a GaAs substrate, reference numeral 2 denotes an n-type GaAs layer, reference 3 denotes a T-shaped gate, reference numeral 4 denotes a source, reference numeral 5 denotes a drain, and symbol L denotes a length of the gate 3.

Conventionally, as patterning methods for forming the T-shaped gate, a photolithography method utilizing a light and an electron beam lithography method utilizing an electron beam have been used.

The photolithography method and the electron beam lithography method have been most widely used upon the performance of patternings during the manufacturing process of a semiconductor device.

The photolithography method is, for example, a technique in which ultraviolet rays are irradiated on a photoresist (PR) through a mask having a pattern comprising a transparent portion and an opaque portion to expose the PR. Then, the exposed PR is developed to obtain a desired PR pattern.

The photolithography method can achieve a submicron pattern having a line-width of about 0.5 μm and also process a number of wafers per unit time since a patterning process is carried out by merely one exposure process which uses ultraviolet rays. Accordingly, this method is advantageous in mass production.

On the other hand, the electron beam lithography method can achieve a submicron pattern having a line-width of about 0.1 μm since this method uses electrons having a characteristic, of a relatively smaller beam spot size as compared to light such as ultraviolet rays. Therefore, this method is widely used for researching super high devices such as GaAs FET.

However the electron beam lithography method has disadvantages in that it has a rate of production relatively lower than that of the photolithography method since all patterns are depicted one by one with an electron beam having a small spot size. The electron beam lithography method has been used to form a T-shaped gate having a submicron length of less than 0.5 μm.

Referring to FIGS. 2a and FIG. 2b, a method for manufacturing a T-shaped gate is illustrated.

As shown in FIG. 2a, first, an electron beam resist(hereinafter, E-beam resist) 11 having a low electron-sensitivity, an E-beam resist 12 having a high electron-sensitivity, and an E-beam resist 13 having a low electron-sensitivity are coated on a substrate 10, in this order. Thereafter, the E-beam resists 11, 12, and 13 are exposed by an electron-beam.

At this time, the E-beam resist 11 contacting the substrate 10 and having a low electron-sensitivity is less exposed than the E-beam resist 12 having a high electron-sensitivity. As shown in FIG. 2a, the E-beam resist 12 is exposed over a region wider than a region which is irradiated by the E-beam, due to a back-scattering phenomenon caused by the substrate 10. Thereafter, the above E-beam resists 11, 12, and 13 are subjected to a development process, to obtain the E-beam resist patterns 11a, 12a, and 13a shown in FIG. 2b.

It is possible to advantageously perform a lift-off process for removing unnecessary metal layers since the E-beam resist 13 having a low electron-sensitivity is formed as the upper most layer. Subsequently, a metal is deposited to form a T-shaped gate 14, as shown in FIG. 2b. Then, a lift-off process is carried out to remove the unnecessary metal layers 14a and the E-beam resist pattern 13a.

As above mentioned, the photolithography method cannot obtain a pattern having a submicron length of less than 0.5 μm. However, this method is chiefly used to produce FETs having a T-shaped gate in great quantities.

Referring to FIGS. 3a through 3d, a method is illustrated where a FET having a T-shaped gate is manufactured using the photolithography method.

First, a source 21 and a drain 22 are formed on each edge of a substrate 20, respectively, as shown in FIG. 3a. As shown in FIG. 3b, an insulation film and a photoresist are formed on the substrate 20, the source 21 and the drain 22, in this order.

The photoresist is coated with a mask and then is subjected to an exposure process and a development process to obtain a photoresist pattern 24 corresponding to a gate length. Subsequently, the insulation film and the substrate 20 is subjected to a wet-etching process using the photoresist pattern 24 as an etch mask.

Accordingly, a portion of the insulation film and a portion of the substrate 20 corresponding to the gate length L are removed to form a groove having a width wider than the gate length L in the surface of the substrate 20. That is, the substrate 20 is etched with a width wider than that of the insulation film pattern 23, due to the wet-etching process.

Subsequently, the photoresist pattern 24 is removed and then a photoresist 25 having a high photo-sensitivity and a photoresist 26 having a low photo-sensitivity are formed on the insulation film pattern 23, in this order, as shown in FIG. 3c. Thereafter, a mask is coated on the photoresist having a low photo-sensitivity. Then, the photoresists are subjected to an exposure process and a development process. At this time, a portion of the photoresist 26 having the low photo-sensitivity is removed by a width wider than the gate length L and a portion of the photoresist 25 having the high photoresist is by a width wider than the width of the removed portion of the photoresist 26 having the low photosensitivity, as shown in FIG. 3c. Accordingly, photoresist patterns 25 and 26 are formed. Subsequently, a metal is deposited to form a gate. As a result, a T-shaped gate 27 is formed over the insulation film pattern 23, and simultaneously an unnecessary metal layer 27a is formed on the photoresist pattern 26. Then, the photoresist patterns 25 and 26 and the unnecessary metal layer 27a are removed using a lift-off process, as shown in FIG. 3d.

The device manufactured by FIGS. 3a to 3d is called a metal semiconductor junction field effect transistor (MSJFET).

However, the above-mentioned conventional patterning method has the following problems.

First, the conventional E-beam lithography method can process wafers at only 4–5 sheets per hour since all patterns should be depicted with an electron-beam having a small spot size. Accordingly, this method is improper for mass production due to the low throughput.

Second, in the conventional photolithography method, it is impossible to achieve the high integration of FET since a submicron pattern of less than 0.5 μm cannot be formed.

This method also requires two sheets of mask to form a T-shaped gate as shown in FIG. 3a to FIG. 3d and also requires double the number of critical mask-arrangement processes thereby deteriorating the production rate of FET and increasing the manufacturing cost.

SUMMARY OF INVENTION

Therefore, an object of the invention is to overcome the conventional disadvantages and to provide a method of making an FET in which a photolithography having a high throughput is performed only once to form a T-shaped gate having asuper-submicron length, thereby enabling the integration degree and improving production rate of the FET.

In one aspect, the present invention provides a method of making an FET comprising the steps of:

forming a source and a drain at each respective edge of a surface of a semiconductor substrate;

forming a first insulation film over entire surfaces of the semiconductor substrate, the source and the drain;

forming a photoresist on the first insulation film;

preforming a photolithography process on the photoresist, to form a photoresist pattern having a first empty space corresponding to a gate length;

forming a second insulation film on the entire surfaces of the exposed first insulation film and the photoresist pattern;

etching the second insulation film, to form sidewall insulation films at sidewalls of the photoresist pattern which forms the first empty space;

etching the first insulation layer using the sidewall insulation films and the photoresist pattern as an etch mask to form a first insulation film pattern, which forms a second empty space having a width smaller than the width of the first empty space below the first empty space;

removing the sidewall insulation films to form a T-shaped empty space; and depositing a conductor to form a T-shaped gate in the T-shaped empty space.

BRIEF DESCRIPTION OF THE DRAWINGS

Other objects and aspects of the invention will become apparent from the following description of embodiments with reference to the accompanying drawings in which:

FIGS. 5a to 5f are cross-sectional views illustrating a method of makings an FET in accordance with a second embodiment of the present invention;

DETAILED DESCRIPTIONS OF THE PREFERRED EMBODIMENTS

Hereinafter, the embodiment of the present invention will be described in detail in conjunction with the attached drawings.

EMBODIMENT I

Referring to FIGS. 4a to 4k, a method of making a FET is illustrated in accordance with a first embodiment.

Figure 1:
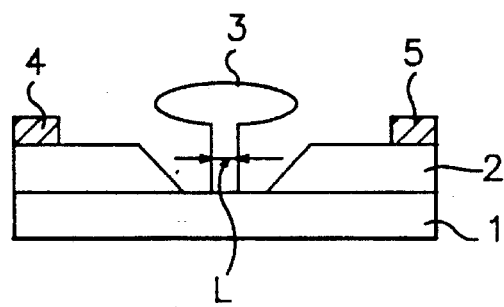
FIG. 1 is a cross-sectional view illustrating the structure of a conventional MSFET having a T-shaped gate.
Figure 2A:
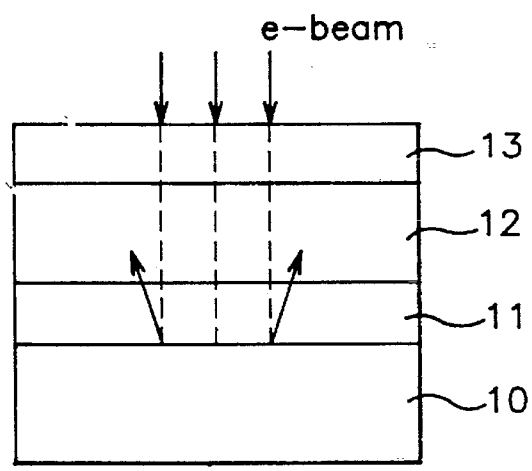
FIGS. 2a and 2b are cross-sectional views illustrating a method of making a T-shaped gate using a conventional electron beam lithography method.
Figure 2B:
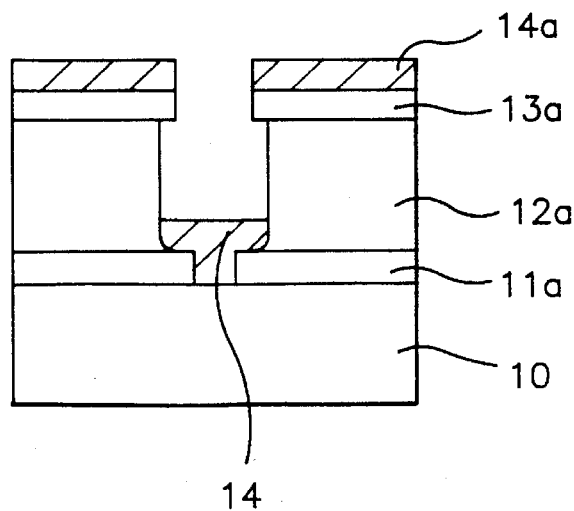
Figure 3A:
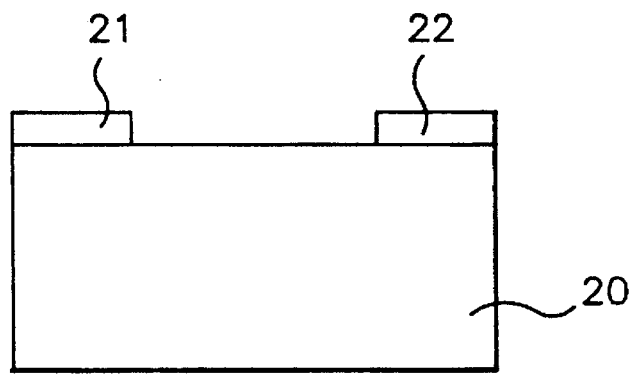
FIGS. 3a to 3d are cross-sectional views illustrating a method of making a T-shaped gate using a conventional photolithography.
Figure 3B:
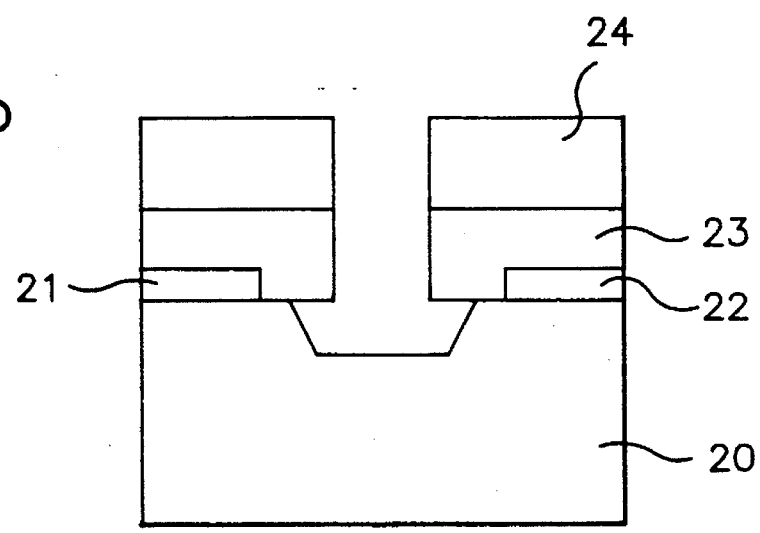
Figure 3C:
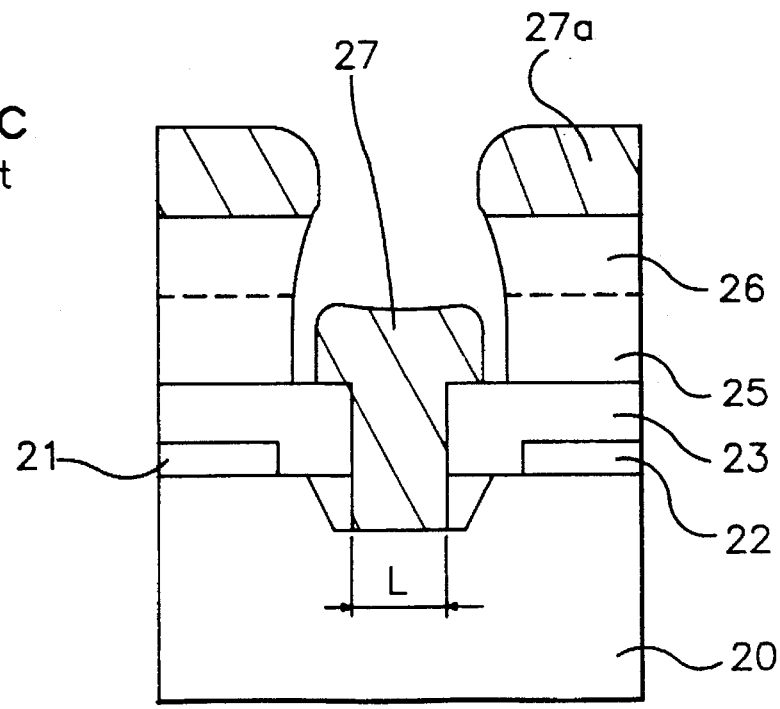
Figure 3D:
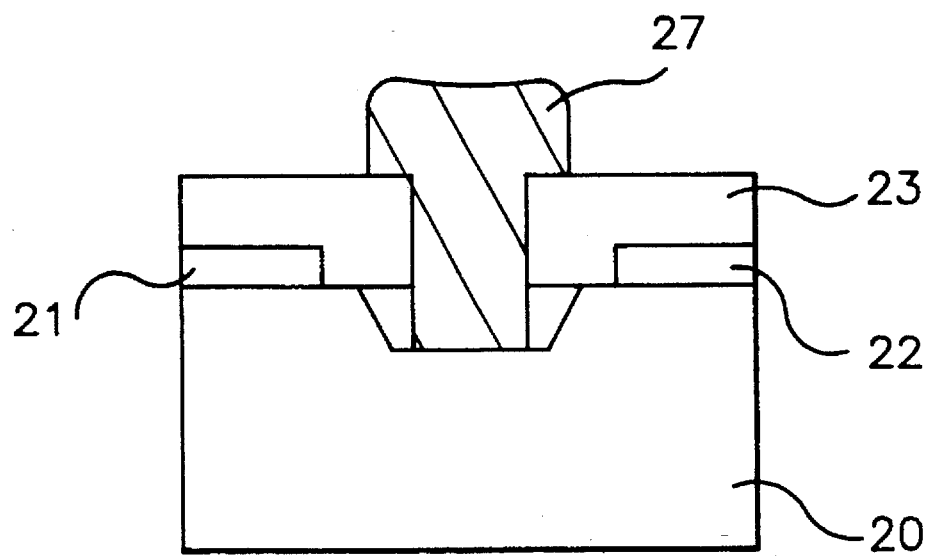
Figure 4A:
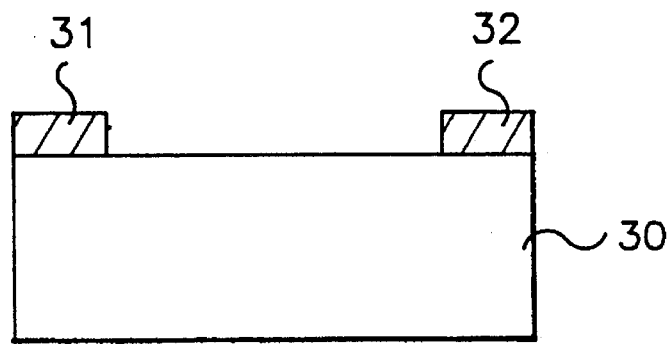
FIGS. 4a to 4k are cross-sectional views illustrating a method of making an FET in accordance with a first embodiment of the present invention.
Figure 4B:
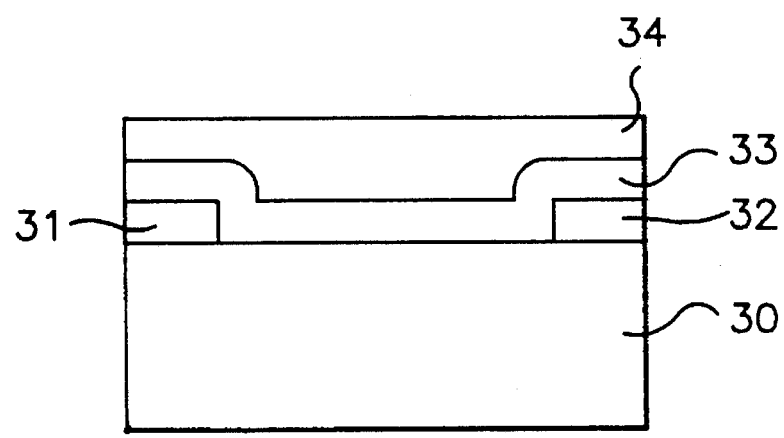

As shown in FIG. 4a, first, a source 31 and a drain 32 are formed on edges of the surface of a semiconductor substrate 30, respectively. Thereafter, a first insulation film 33 is formed on the source 31, the drain 32 and the semiconductor substrate 30, as shown in FIG. 4b.

A polyimide or a photoresist such as PMGI and PMMA may be used as a material of the first insulation film 33, provided that a material of the first insulation film 33 has an etch selectivity higher than that of a second insulation film which will be formed thereafter and is not damaged upon the development of a photoresist to be formed thereon.

Figure 4C:
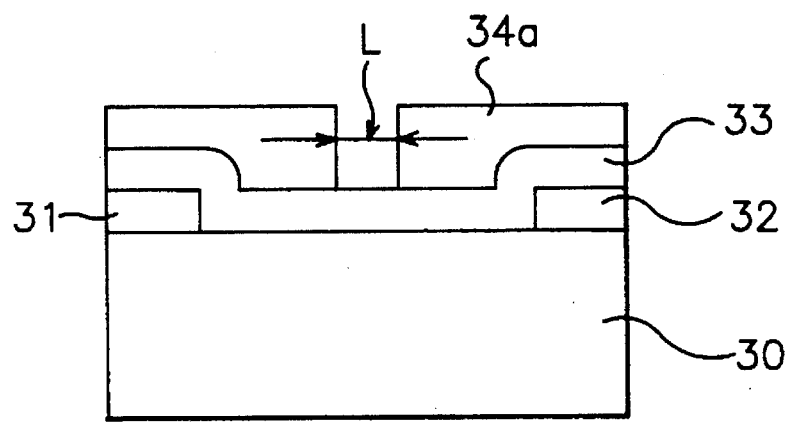

Thereafter, the first insulation film 33 is subjected to a heat-treatment to firm the film and then a photoresist 34 is coated on the first insulation film 33. Subsequently, the photoresist 34 is subjected to a photolithography process, thereby to form photoresist patterns 34a having an empty space which is formed with a width of 0.5–1.0 μm corresponding to a gate length L, as shown in FIG. 4c.

Figure 4D:
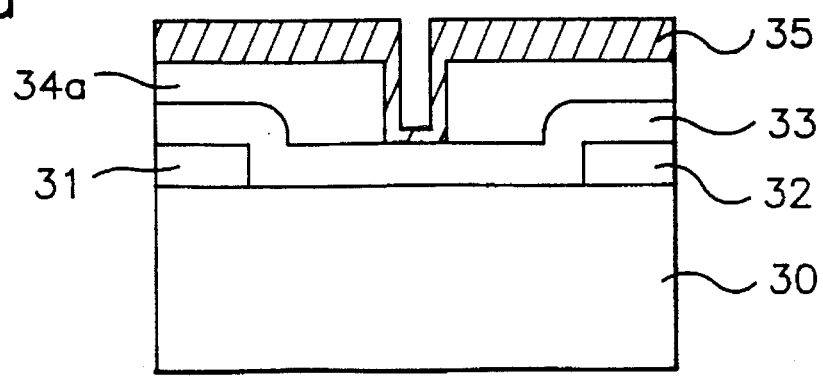

As shown in FIG. 4d, a second insulation film 35 is formed on the entire exposed surfaces of the first insulation film 33 and the photoresist pattern 34a. The second insulation film 35 is formed at a low temperature using a plasma enhanced chemical vapour deposition (PECVD) method or a sputtering method to obtain a good step coverage. $SiO_2$ is used as a material of the second insulation film 35.

Figure 4E:
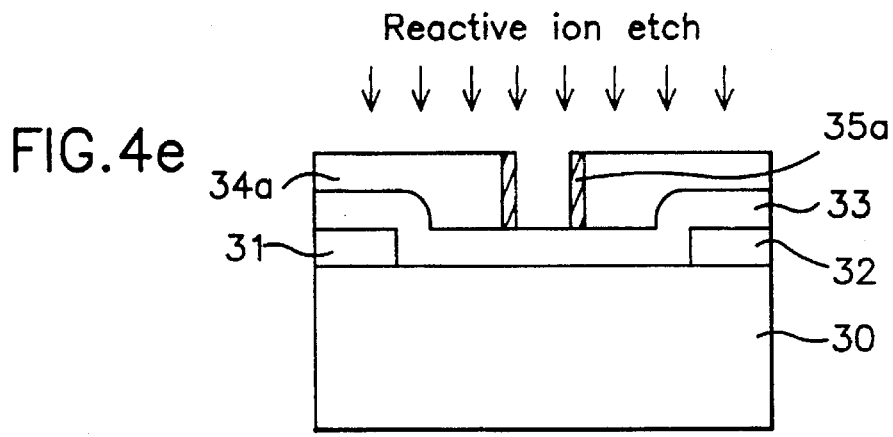

Subsequently, the second insulation film 35 is subjected to a reactive ion etch process using $CF_4$ as an etching gas, thereby to form sidewall insulation films 35a having a thickness of 0.1–0.3 μm at the sidewalls of the photoresist patterns 34a, as shown in FIG. 4e.

Figure 4F:
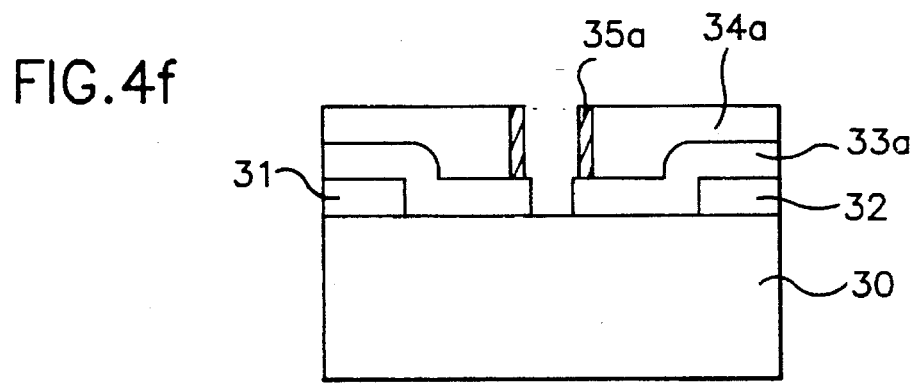

As shown in FIG. 4f, the first insulation film 33 is subjected to an etch process using the sidewall insulation films 35a and the phohoresist pattern 34a as etching masks, to remove the exposed portion of the first insulation film 33. Accordingly, a first insulation film pattern 33a is formed.

An RIE method, which is a kind of dry etching method, is used to form the first insulation film pattern 33a, when using a polyamide as the material of the first insulation film 33. On the other hand, a development process is used to form the first insulation film pattern 33a, when using a photoresist as the material of the first insulation film 33.

Figure 4G:
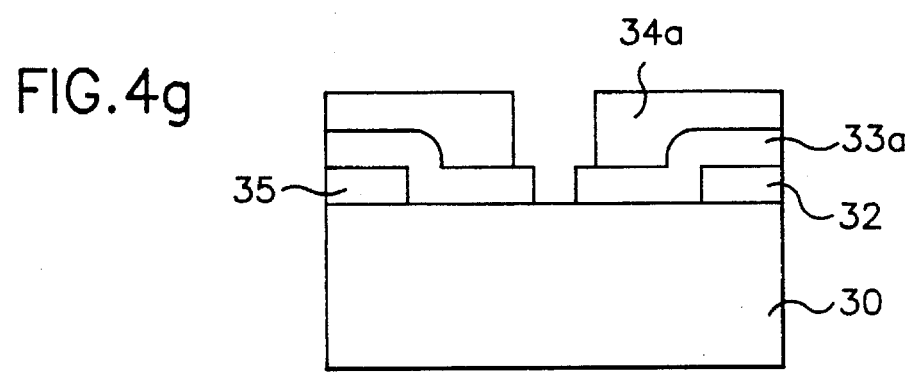

As shown in FIG. 4g, the sidewall insulation films 35a are removed using an HF solution as an etching solution to form a T-shaped empty space in which a T-shaped gate will be formed by the photoresist pattern 34a and the first insulation pattern 33a. That is, the gate length L of 0.5–1.0 μm is reduced by 0.2–0.6 μm. Accordingly, it is possible to obtain a gate length of 0.3–0.4 μm which can not be obtained by the conventional photolithography method.

Figure 4H:
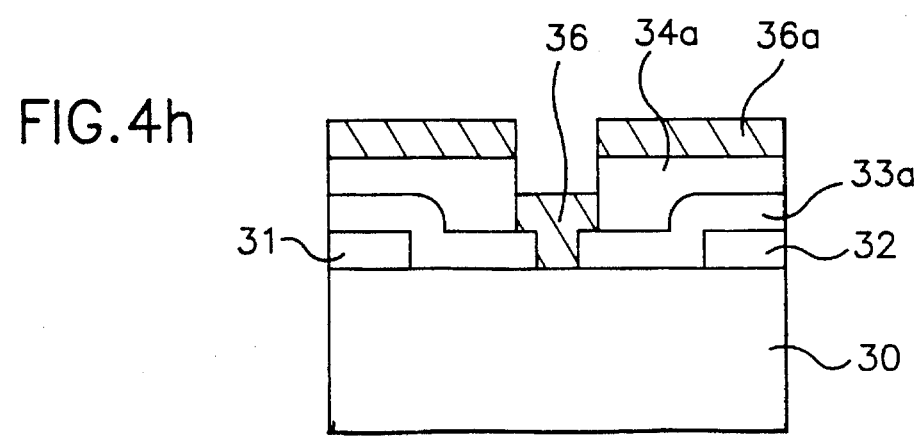

Subsequently, a metal is deposited to form a T-shaped gate to form a T-shaped gate 36 which contacts the surface of the semiconductor substrate 30 in the T-shaped empty space, as shown in FIG. 4h.

Figure 4I:
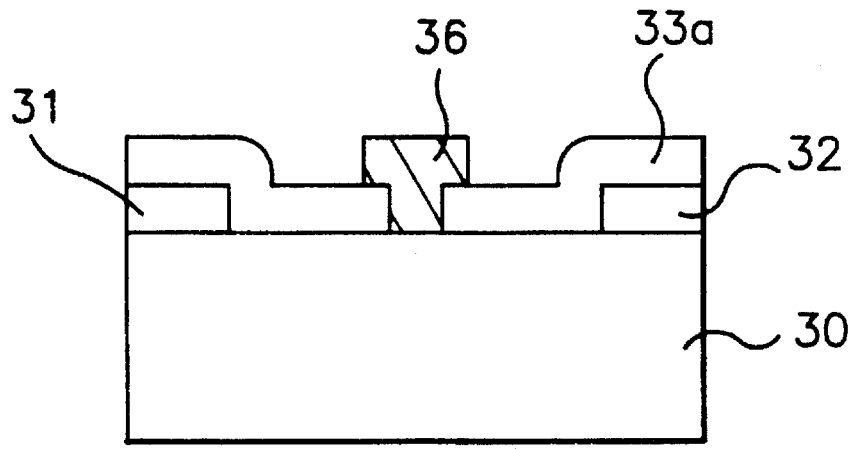
Figure 4J:
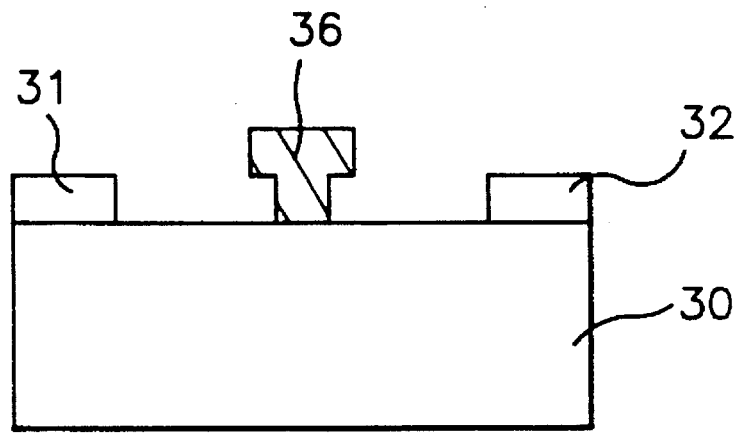

At this time, an unnecessary metal layer 36a is formed on the photoresist pattern 34a. Subsequently, the photoresist pattern 34a and the unnecessary metal layer 36a are removed using a lift-off process, as shown in FIG. 4i. Then, the first insulation film pattern 33a is removed, as shown in FIG. 4j.

Figure 4K:
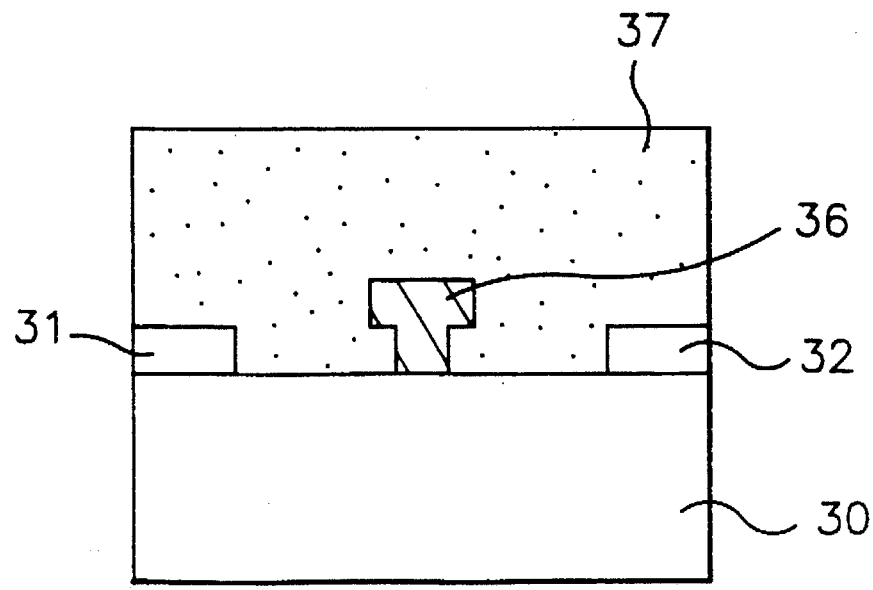

Finally, a third insulation film 37 is formed with its flat surface on the T-shaped gate 36, the source 31 and the drain 32, as shown in FIG. 4k.

Herein, a polysilicon having a conductivity type may be used as a material of the gate.

According to the first embodiment, as above mentioned, it is possible to obtain a super-submicron pattern of 0.3–0.4 μm without using the conventional E-beam lithography method, by using the sidewall insulation films 35a. Accordingly, the high integration of FETs can be embodied.

It is also possible to simplify the manufacturing process of FET and to increase the production rate of FETs as compared to the conventional photolithography method since only one photolithography process is carried out to form the T-shaped gate.

Moreover, it is possible to reduce the manufacturing cost of the FETs since only one photography process is carried out and also only one sheet of mask is used.

EMBODIMENT II

A method of making an FET according to a second embodiment is similar to those of the first embodiment as shown in FIG. 4a to FIG. 4f.

Figure 5A:
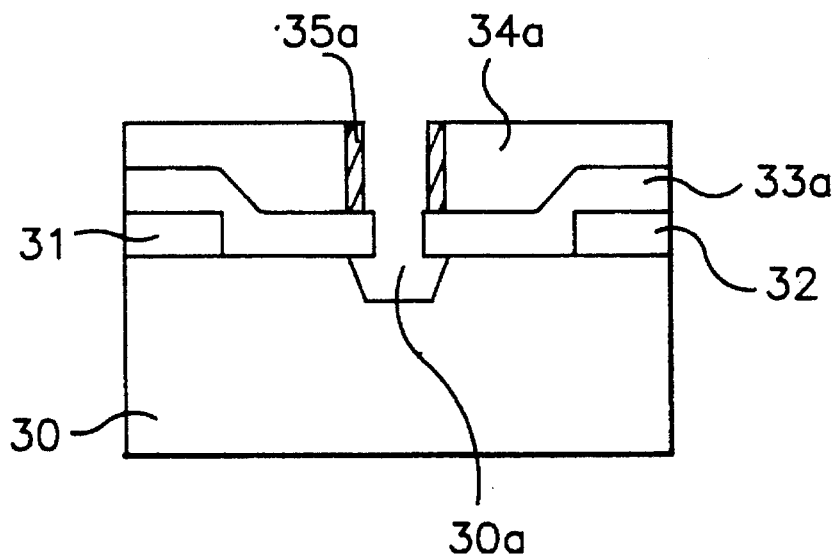

Continuing from FIG. 4f and as shown in FIG. 5a, the exposed portion of the first insulation film is removed using the sidewall insulation films 35a and the photoresist pattern 34a as an etching mask in similar to FIG. 4f, thereby to form first insulation film patterns 33a which have an empty surface having a width of 0.3–0.4 μm between them.

Figure 5B:
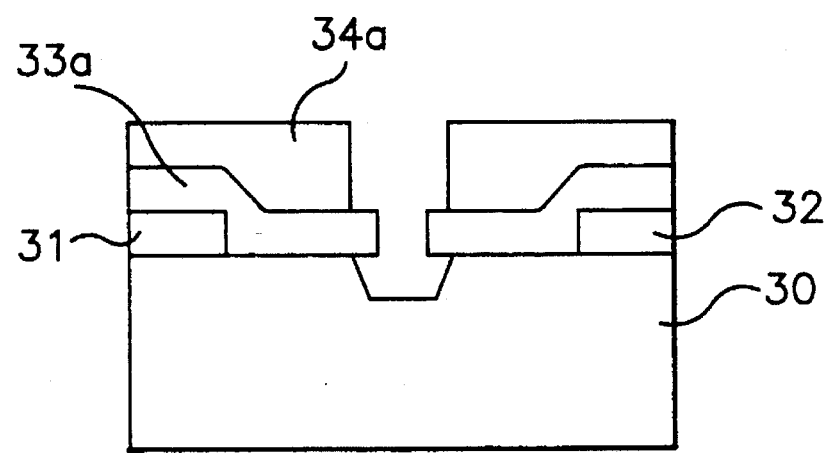

Subsequently, the exposed surface of the semiconductor substrate 30 is subjected to a wet-etch process to form a groove 30a having a width wider than that of the above-width between the first insulation film pattern 33a. Then, as shown in FIG. 5b, the sidewall insulation films 35a are removed using an HF solution to form a T-shaped empty space between the photoresist pattern 34a and the first insulation film pattern 33a in which a T-shaped gate will be formed.

Figure 5C:
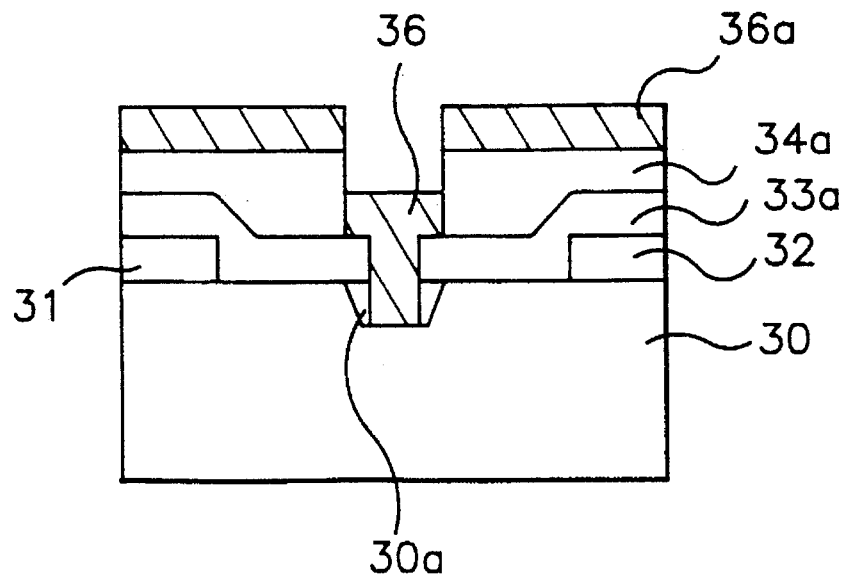

As shown in FIG. 5c, a T-shaped gate 36, which contacts the bottom surface of the groove 30a, is formed in the T-shaped empty space if a metal is deposited over the entire exposed surface.

At this time, unnecessary metal layers 36a are formed on the photoresist patterns 34a.

The photoresist patterns 34a and the unnecessary metal layers 36a are then removed as shown in FIG. 5d and the first insulation film pattern 33a is removed using a method similar to that of FIG. 4f, as shown in FIG. 5e. Then, as shown in FIG. 5f, a third insulation film 37 is formed with its flat surface on the source 31, the drain 32 and the T-shaped gate 36.

According to the second embodiment, the gate length is relatively longer since the groove 30a is formed on the surface of the semiconductor substrate 30.

Accordingly, it is possible to relatively shorten the distance between the source 31 and the drain 32 and moreover to embody the high integration of FETs. It is also possible to lower the height of the FET since the T-shaped gate 36 is located in the semiconductor substrate 30 by the depth of the groove 30a, due to the formation of the groove 30a. As a result, it is possible to embody the high integration of FET.

The effects of the first embodiment can be achieved in the second embodiment. Also, the materials used in the second embodiment are the same as the first embodiment.

EMBODIMENT III

Referring to FIG. 6a through FIG. 6l, a method of making an FET is illustrated in accordance with a third embodiment of the present invention.

Figure 6A:
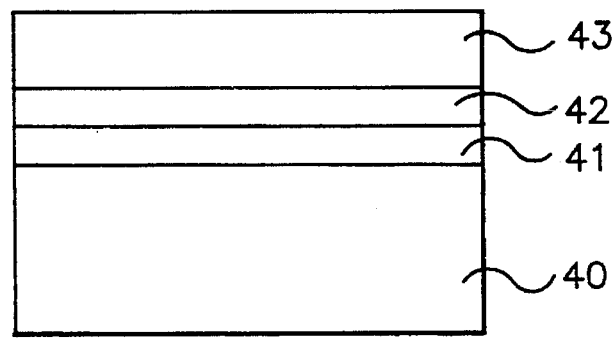
FIGS. 6a to 6l are cross-sectional views illustrating a method of making an FET in accordance with a third embodiment of the present invention.

First, on a semiconductor substrate 40, a first insulation film 41, a mixture prevention layer 42 and a photoresist 43 are formed in this order, as shown in FIG. 6a.

Figure 6B:
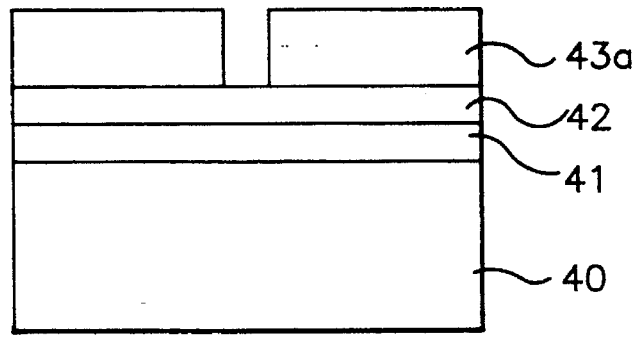

As shown in FIG. 6b, the photoresist is subjected to a conventional photolithography process to form a photoresist pattern 43a having an empty space corresponding to a gate-length of 0.5–1.0 μm.

Figure 6C:
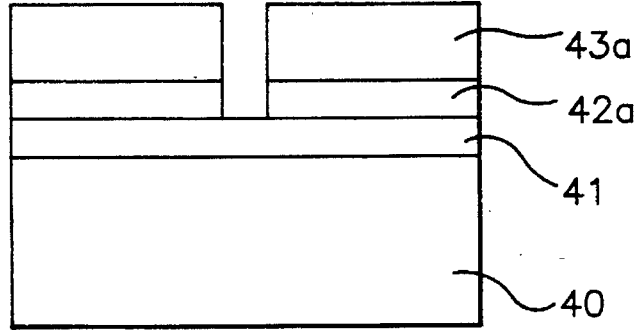

As shown in FIG. 6c, the mixture prevention layer 42 is subjected to an RIE method using the photoresist pattern 43a as an etching mask, thereby to remove the exposed mixture prevention layer 42 by a width of 0.1–0.5 μm.

Thus, a mixture prevention layer pattern 42a is formed having an empty space, which is corresponding to the upper part of a T-shape. One of Ni, Ge, Si, SiN and $SiO_2$ may be used as the material of the mixture prevention layer 42.

Figure 6D:
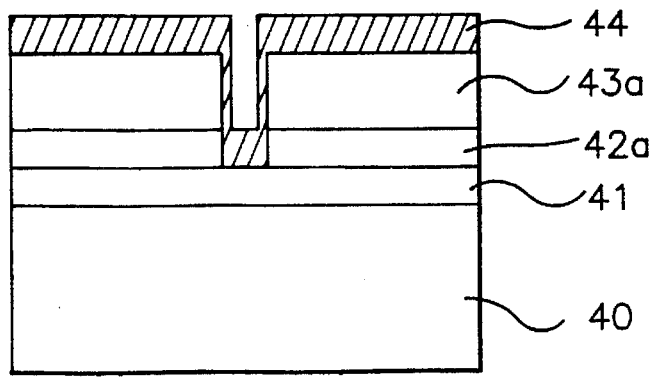
Figure 6E:
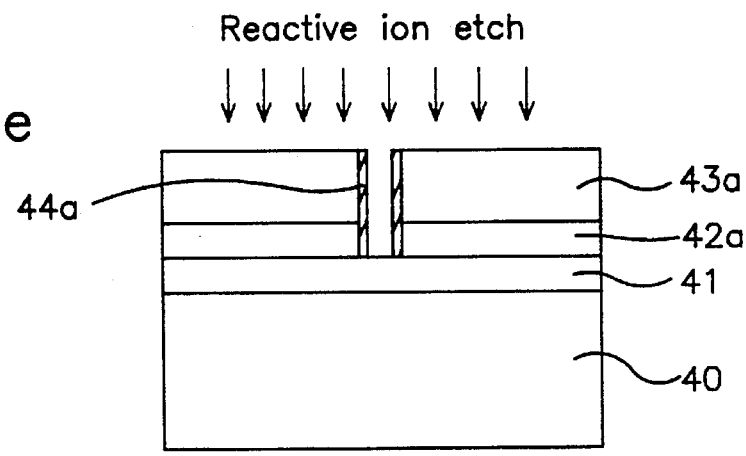

As shown in FIG. 6d, over the entire surface of the photoresist pattern 43a and the mixture prevention layer pattern 42a, second insulation film 44 is formed. Subsequently, the second insulation film 44 is etched with the RIE method to form sidewall insulation films 44a having a width of 0.1–0.3 μm at the sidewalls of the first photoresist pattern 43a, as shown in FIG. 6e.

Figure 6F:
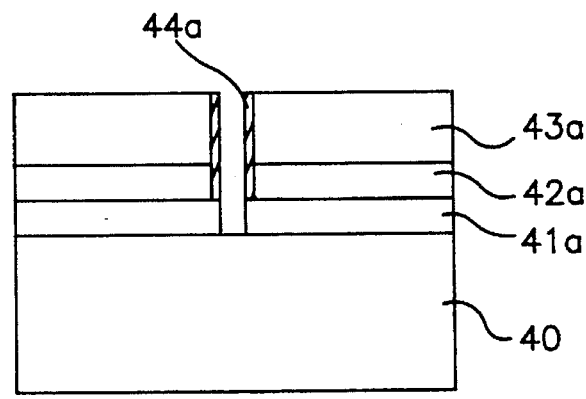

As shown in FIG. 6f, the first insulation film 41 is etched using the photoresist pattern 43a and the sidewall insulation films 44a as an etching mask to form a first insulation film pattern 41a having an empty space corresponding to the lower part of the T-shape.

Figure 6G:
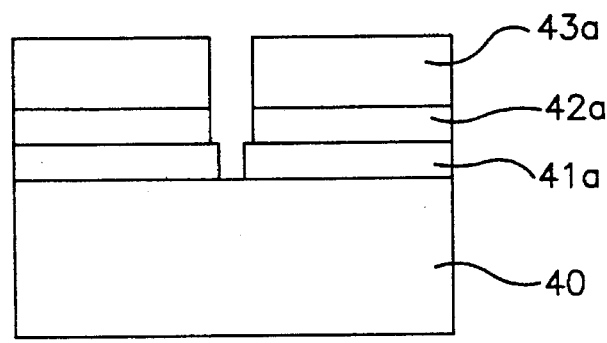
Figure 6H:
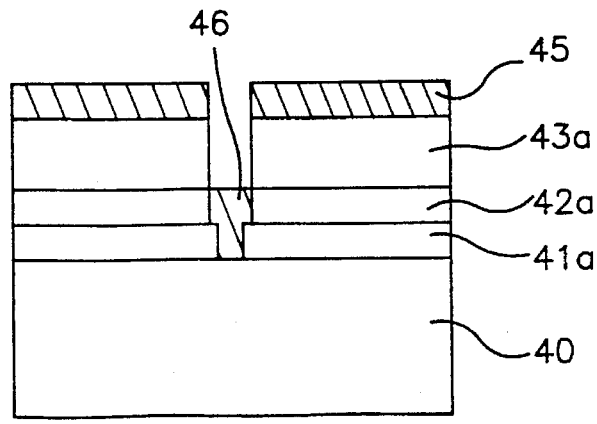

As shown in FIG. 6g, the sidewall insulation films 44a are then removed. As a result, a T-shaped empty space for forming a T-shaped gate is formed between the first insulation film patterns 41a, the mixture prevention layer patterns 42a and the first photoresist patterns 43a. Then, as shown in FIG. 6h, a metal is deposited using a chemical vapour deposition (CVD) method, to form the T-shaped gate 46, which contacts the surface of the semiconductor substrate 40 in the T-shaped empty space.

Figure 6I:
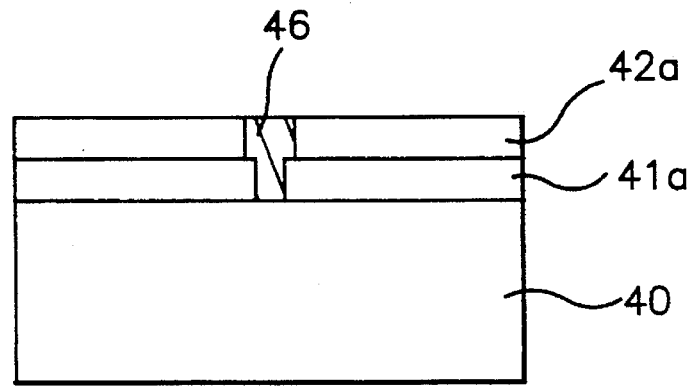
Figure 6J:
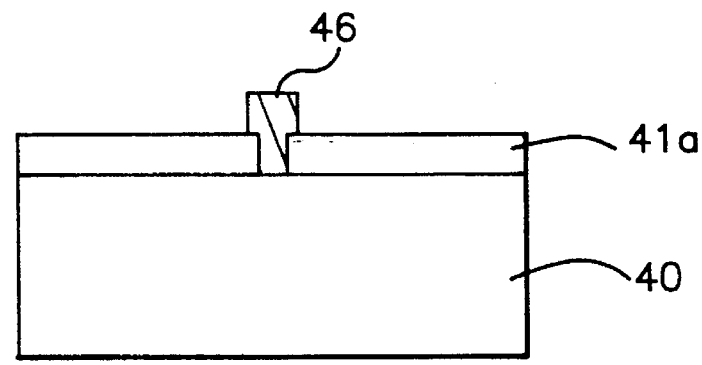
Figure 6K:
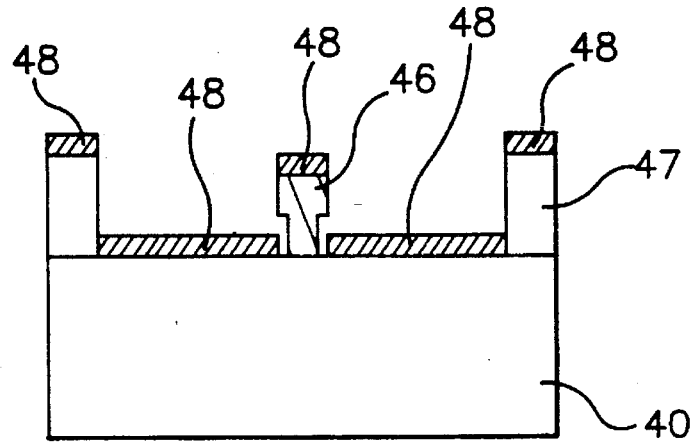

At this time, an unnecessary metal layer 46a is formed on the surface of the first photoresist pattern 43a. Subsequently, the first photoresist patterns 43a and the metal layer 46a are removed with a lift-off process, as shown in FIG. 6i. Then, the mixture prevention layer pattern 42a is removed, as shown in FIG. 6j. Then, the first insulation film pattern 41a is removed and a second photoresist pattern 47 is formed on the surface of the semiconductor substrate 40, except at a selected source region and a selected drain region.

Thereafter, a metal is deposited using the CVD method to form metal layers 48 on the second photoresist pattern 47 and the surface of the semiconductor substrate 40 which corresponds to the T-shaped gate 46, the selected source region and the selected drain region.

Figure 6L:
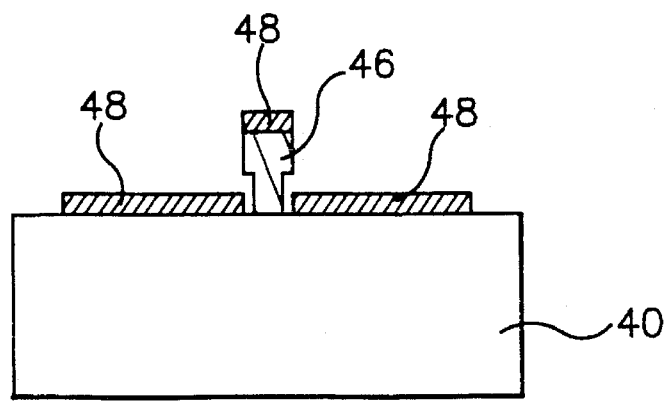

Finally, the second photoresist pattern 47 and the unnecessary metal layer 48 formed thereon are removed using a lift-off process, as shown in FIG. 6l. The two metal layers 48, which are located at both sides of the T-shaped gate 46 and formed on the semiconductor substrate, serve as a source and a drain, respectively.

According to the third embodiment, as above mentioned, it is possible to remove the unnecessary metal layer 46a and the first photoresist pattern 43a with a lift-off process without damaging the upper part of the T-shaped gate 46 since the mixture prevention layer 42 is added.

As in the second embodiment, the materials used in the third embodiment are similar to the materials of the first embodiment.

EMBODIMENT IV

A method of making an FET in accordance with a fourth embodiment of the present invention is partly similar to FIG. 4a through FIG. 4f of the above-first embodiment.

Figure 7A:
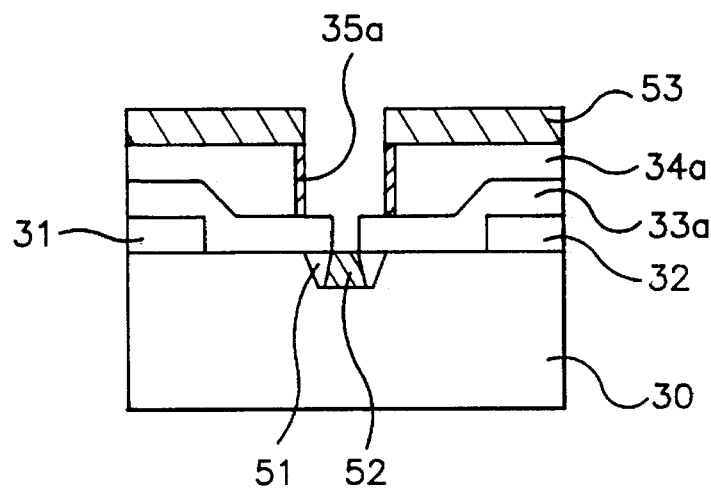
FIGS. 7a to 7d are cross-sectional views illustrating a method of making an FET in accordance with a fourth embodiment of the present invention.

Continuing from FIG. 4f the semiconductor substrate 30 is wet-etched using the photoresist pattern 34a, the sidewall insulation film 35a and the first insulation film pattern 33a as an etching mask, thereby forming a groove 51 having a width wider than the interval between the sidewall insulations films 35a on the surface of the semiconductor substrate 30, as shown in FIG. 7a. Thereafter, a metal is deposited using a CVD method to form a gate 52 having a height from the bottom surface of the groove 51 to the surface of the semiconductor substrate 30. At this time, an unnecessary metal layer 53 is formed on the photoresist pattern 34a.

Figure 7B:
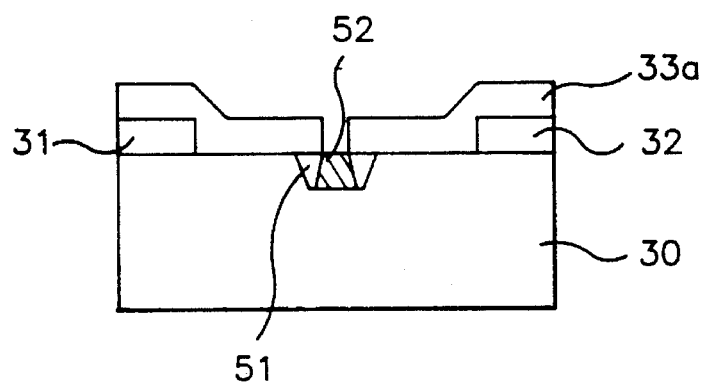
Figure 7C:
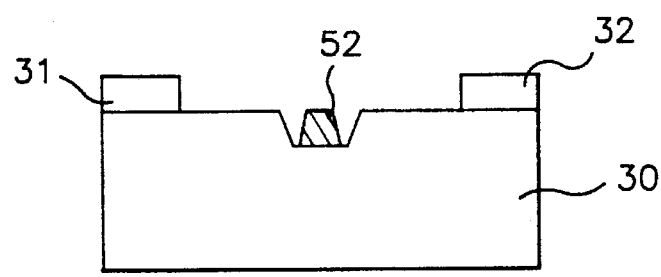
Figure 7D:
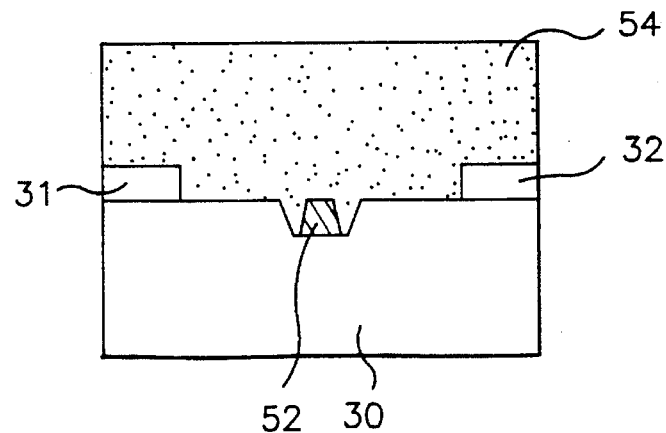

Subsequently, the photoresist pattern 34a, the sidewall insulation film 35a and the unnecessary metal layer 53 are all removed using a lift-off process, as shown in FIG. 7b. Then, the first insulation film pattern 33a is removed, as shown in FIG. 7c.

Finally, over the gate 52, the groove 51, the source 31, the drain 32 and the exposed surface of the semiconductor substrate 30, a third insulation film 54 is formed having its flat surface serving as a protection film.

As in the third embodiment, the materials used in the fourth embodiment are similar to the first embodiment.

According to the fourth embodiment, it is possible to lower the height of the FET since the gate is formed in the groove. Accordingly, the fourth embodiment has an advantage, in that FETs can be formed with a high degree of integration.

Also, there is another advantage, in that FETs can be formed with a high degree of integration since the distance between the source and the drain is reduced.

EMBODIMENT V

Referring to FIGS. 8a through FIG. 8e, a method of making a FET is illustrated in accordance with a fifth embodiment of the present invention.

Figure 8A:
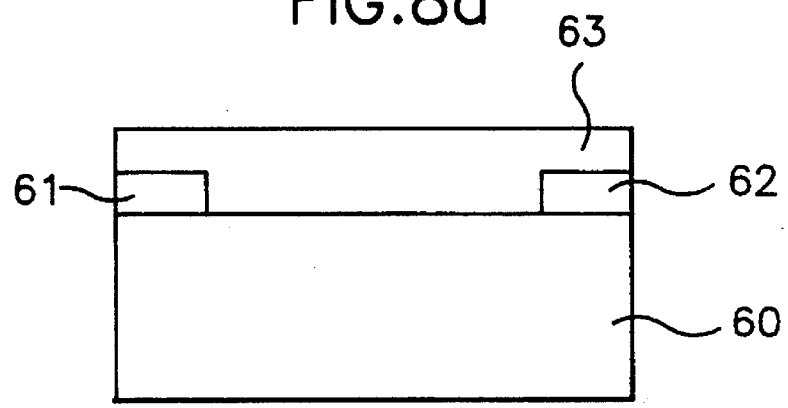
FIGS. 8a to 8e are cross-sectional views illustrating a method of making an FET in accordance with a fifth embodiment of the present invention.

As shown in FIG. 8a, first, a source 61 and a drain 62 are formed at both edges of the surface of a semiconductor substrate 60, respectively. Thereafter, a first insulation film 63 having a flat surface is formed on the entire exposed surface of the semiconductor substrate 60, the source 61 and the drain 62, using a CVD method.

Figure 8B:
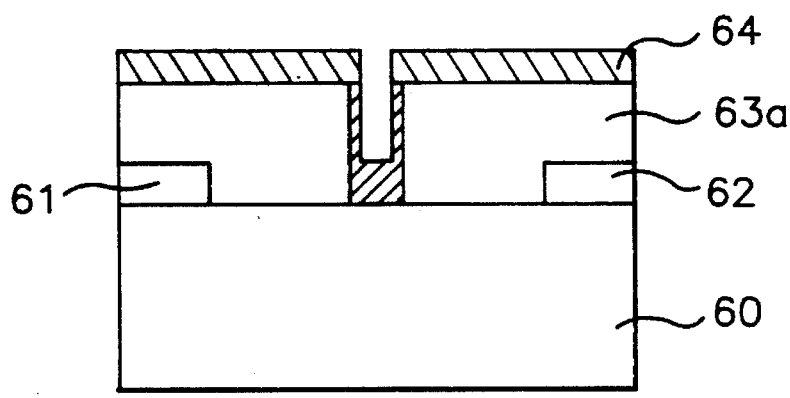

Subsequently, a heat-treatment process is carried out to firm the first insulation film 63 and then the first insulation film 63 is patterned to form first insulation film patterns 63a having an empty space with a width of 0.5–1.0 μm corresponding to a gate length between them, as shown in FIG. 8b.

Figure 8C:
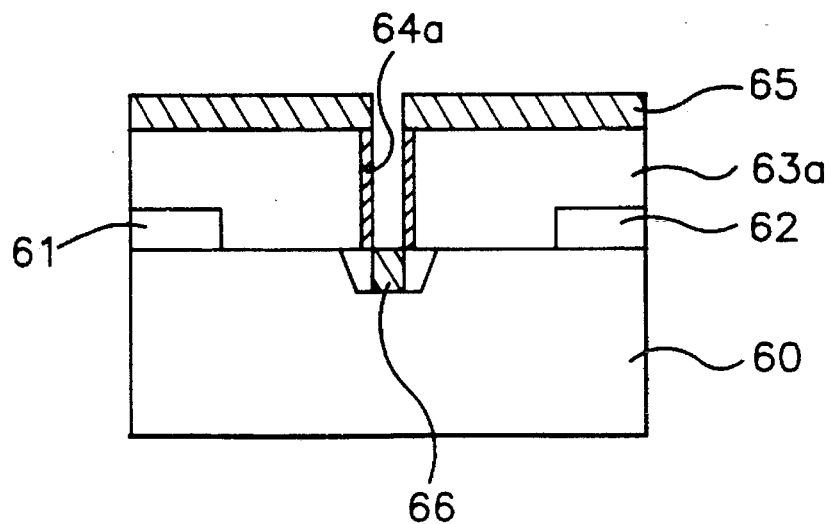

A second insulation film 64 is then formed on the entire exposed surface of the first insulation film patterns 63a and the semiconductor substrate 60 using a CVD method. As shown in FIG. 8c, the second insulation film 64 is etched using the RIE method to form sidewall insulation films 64a having a width of 0.1–0.3 μm at the sidewalls of first insulation film patterns 63a.

Subsequently, the semiconductor substrate 60 is wet-etched using the first insulation film patterns 63a and the sidewall insulation film patterns 64a as an etching mask, thereby forming a groove, having a width wider than the interval between the sidewall insulation films 64a, on the surface of the semiconductor substrate 60. Thereafter, a metal is deposited, using a CVD method, to form a gate 66 having a height from the bottom surface of the groove to the surface of the semiconductor substrate 60.

Figure 8D:
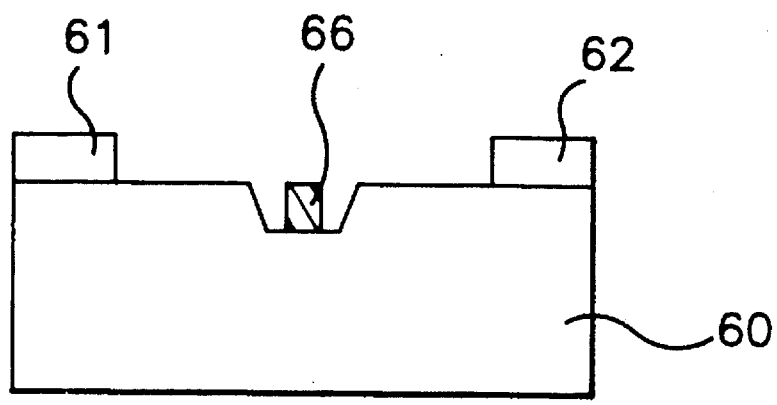
Figure 8E:
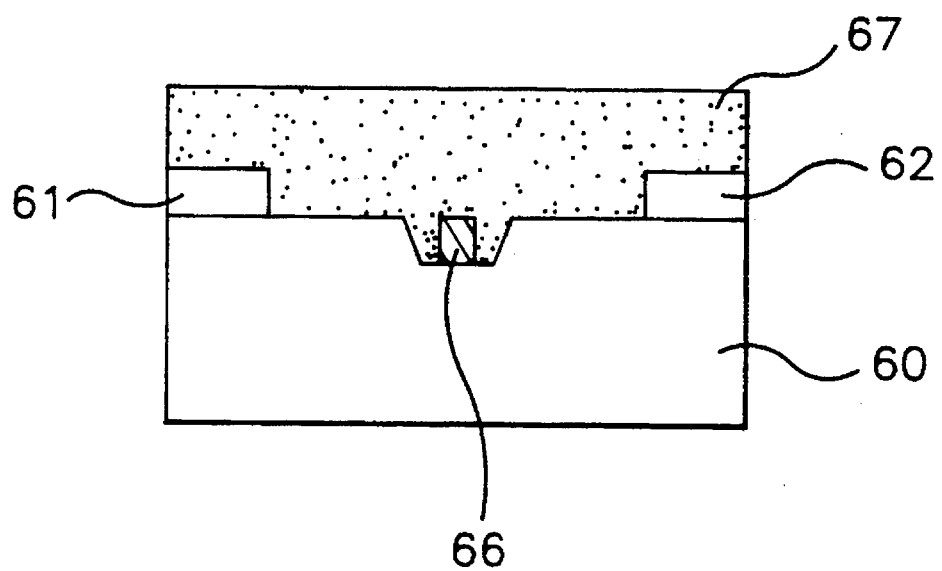

At this time, an unnecessary metal layer 65 is formed on the surface of the first insulation film patterns 63a. Accordingly, a lift-off process is carried out to remove the first insulation film pattern 63a, the sidewall insulation film 64a and the unnecessary metal layer 65, as shown in FIG. 8d.

Finally, over the exposed surface of the groove, the gate 66, the source 61, the drain 62 and the semiconductor substrate 60, a third insulation film 67 is formed having its flat surface serving as a protection film.

The materials used in the fifth embodiment are also similar to the above-first embodiment.

According to the fifth embodiment, the number of manufacturing processes can be reduced, as compared with the fourth embodiment.

Although the preferred embodiments of the invention have been disclosed for illustrative purpose, those skilled in the art will appreciated that various modifications, additions and substitutions are possible, without departing from the scope and spirit of the invention as disclosed in the accompanying claims.

What is claimed is:

1. A method of making an FET having a semiconductor substrate, a source, and a drain, the method comprising the steps of:

(a) forming the source and the drain at respective locations on a surface of the semiconductor substrate;

(b) forming a first insulation film on said surface of the semiconductor substrate and the source and the drain;

(c) coating a photoresist on the first insulation film;

(d) patterning the photoresist using a photolithography process to form a photoresist pattern, an edge portion of said photoresist pattern having sidewalls defining a first space, said first space exposing a portion of said first insulation film corresponding to a gate length between the source and the drain;

(e) forming a second insulating film on said exposed portion of the first insulation film and the patterned photoresist including said sidewalls of said patterned photoresist;

(f) etching the second insulation film to form sidewall insulation films at said sidewalls of the patterned photoresist defining the first space;

(g) etching the first insulation film using the sidewall insulation films and the photoresist pattern as an etching mask to form first insulation film patterns, said first insulation film patterns forming a second space beneath the first space, the second space having a width smaller than a width of the first space;

(h) removing the sidewall insulation films to form a T-shaped space;

(i) depositing a conductive material to form a T-shaped gate in the T-shaped space, said conductive material also being deposited on said patterned photoresist;

(j) removing the patterned photoresist and said conductive material deposited on the patterned photoresist after forming the T-shaped gate; and (k) removing the first insulation film patterns.

2. A method in accordance with claim 1, further comprising the step of:

(l) forming a third insulation film serving as a protection film on an exposed portion of the substrate, the source, the drain and the T-shaped gate.

3. A method in accordance with claim 1, wherein the removing step (j) is carried out using a lift-off process.

4. A method in accordance with claim 1, further comprising a step of performing a heat-treatment process to harden the first insulation film between the step(b) and the step (c).

5. A method in accordance with claim 1, wherein the first insulation film is formed with an etch selectivity higher than that of the second insulation film.

6. A method in accordance with claim 1, wherein the first insulation film is made of one of a photoresist and a polyimide.

7. A method in accordance with claim 1, wherein the etching step (f) is carried out by an RIE method.

8. A method in accordance with claim 7, wherein the RIE method uses $CF_4$ as an etch gas.

9. A method in accordance with claim 1, wherein the second insulation film is formed using one of a sputtering method and a PECVD method.

10. A method in accordance with claim 1, wherein the sidewall insulation films are removed by an HF solution.

11. A method in accordance with claim 1, wherein the second insulation film is made of $SiO_2$.

12. A method in accordance with claim 1, wherein the gate is made of one of a metal and a polysilicon having a conductivity type.

* * * * *